(12) United States Patent
Hu et al.

(10) Patent No.: US 6,787,856 B2
(45) Date of Patent: Sep. 7, 2004

(54) LOW TRIGGERING N MOS TRANSISTOR FOR ELECTROSTATIC DISCHARGE PROTECTION DEVICE

(75) Inventors: David Hu, Singapore (SG); Jun Cai, Singapore (SG)

(73) Assignee: Nano Silicon Pte. Ltd., Singapore (SG)

( * ) Notice: Subject to any disclaimer, the term of this patent is extended or adjusted under 35 U.S.C. 154(b) by 14 days.

(21) Appl. No.: 10/200,811

(22) Filed: Jul. 22, 2002

(65) Prior Publication Data

US 2003/0102487 A1 Jun. 5, 2003

Related U.S. Application Data

(62) Division of application No. 09/999,246, filed on Dec. 3, 2001, now Pat. No. 6,444,510.

(51) Int. Cl.[7] .............................................. H01L 23/62
(52) U.S. Cl. ....................... 257/361; 257/563; 257/408; 257/355
(58) Field of Search .......................... 257/173, 361–363, 257/355–357, 408–411, 328, 546, 563–565, 205; 438/309, 342, 216, 261

(56) References Cited

U.S. PATENT DOCUMENTS

| | | | |
|---|---|---|---|
| 5,043,782 A | 8/1991 | Avery | 357/23.13 |
| 5,519,242 A | 5/1996 | Avery | 257/356 |
| 5,559,352 A | 9/1996 | Hsue et al. | 257/328 |
| 5,689,133 A | 11/1997 | Li et al. | 257/361 |
| 5,898,205 A | 4/1999 | Lee | 257/355 |
| 5,969,923 A | 10/1999 | Avery | 361/56 |
| 6,066,879 A * | 5/2000 | Lee et al. | 257/355 |
| 6,458,632 B1 * | 10/2002 | Song et al. | 438/133 |
| 6,538,266 B2 * | 3/2003 | Lee et al. | 257/173 |

OTHER PUBLICATIONS

Chen et al., "Design Methodilogy and Optimization of Gat Driven NMOS ESD Protection Circuits in SUbmicron CMOS Processes", IEEE, vol. 45, Dec. 1998, pp. 2448–2456.*
The Paper by Amerasekera et al., "Correlating Drain Junction Scaling, Salicide Thickness, and Lateral NPN Behavior, with the ESD/EOS Performance of a 0.25 μm CMOS Process," 1996, IEEE, IEDM 96-893 to 96-896.

(List continued on next page.)

*Primary Examiner*—Carl Whitehead, Jr.
*Assistant Examiner*—Yennhu B. Huynh
(74) *Attorney, Agent, or Firm*—George O. Saile; Stephen B. Ackerman; William J. Stoffel

(57) ABSTRACT

An ESD device and method using parasitic bipolar transistors that are silicided. The first embodiment is a parasitic Bipolar Junction Transistor comprised of n+/n−/p−/n−/n+ regions. The emitter is formed of the second N+ region and the second N− well. The parasitic base is formed by the p− substrate or well. The collector is formed of the first well and the first n+ region. The benefit of the first embodiment is the trigger voltage is lower because the junction between the n− well (emitter) and P− substrate (base) and the junction between P− substrate (base) and the n-well have lower cross over concentrations. The second embodiment is similar to the first embodiment with the addition of the first gate. The first gate is preferably connected to the first n+ region and the Vpad. The third embodiment contains the same elements as the second embodiment with the addition of a third n+ region. The third n+ region is preferably shorted (or connected) to the first p+ region and the second n+ region. The third embodiment forms a second NPN parasitic bipolar using the third N+ region as an emitter. The forth embodiment contains the same elements as the third embodiment with the addition of a second gate over the first isolation region. The second gate is preferably connected to the third n+ region to the first p+ region and the second n+ region. The gate changes the electrical characteristics of the first parasitic bipolar transistor.

5 Claims, 5 Drawing Sheets

OTHER PUBLICATIONS

The Paper by Charvaka Duvvury, "ESD: Design for IC Chip Quality and Reliability", 2000 IEEE, pp. 251–259.

The Paper by Polgreen et al., "Improving the ESD Failure Threshold of Silicided n–MOS Output Transistors by Ensuring Uniform Current Flow," IEEE Transactions on Electron Devices, vol. 39, No. 2, Feb. 1992, pp. 379–388.

The Paper by Natermans et al., "The Effect of Silicide on ESD Performance," IEEE 1999, 37th Annual International Reliability Physics Symposium, San Diego, CA, pp. 154–158.

Chen et al., "Design Methodology and Optimization of Gate–Driven NMOS ESD Protection Circuits in Submicron CMOS Processes," IEEE Trans. on Electron Devices, vol. 45, No. 12, Dec. 1998, pp. 2448–2456.

* cited by examiner

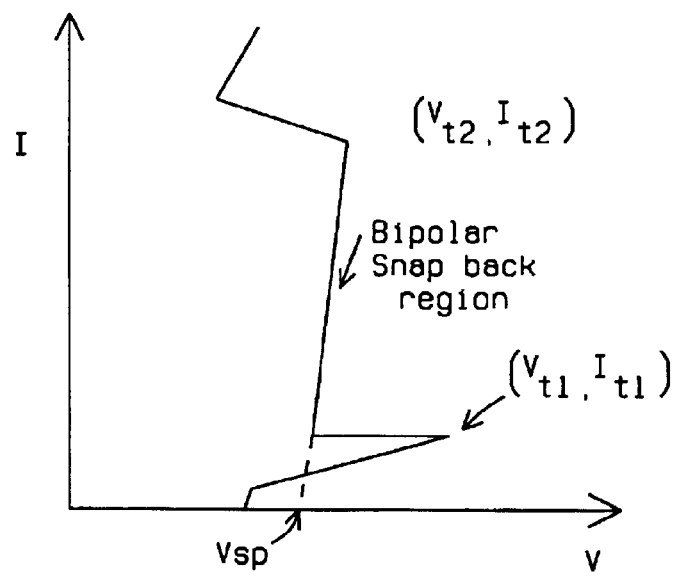
*FIG. 5C — Prior Art*
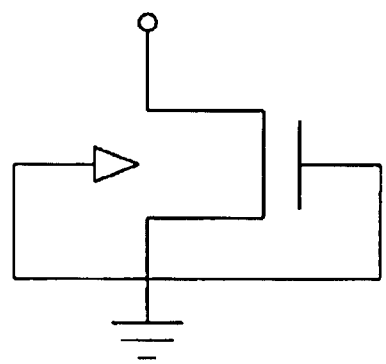
*FIG. 5D — Prior Art*

LOW TRIGGERING N MOS TRANSISTOR FOR ELECTROSTATIC DISCHARGE PROTECTION DEVICE

This is a division of patent application Ser. No. 09/999,246, filing date Dec. 3, 2001 now U.S. Pat. No. 6,444,510, Low Triggering Nmos Transistor For Esd Protection Working Under Fully Silicided Process Without Silicided Blocks, assigned to the same assignee as the present invention.

BACKGROUND OF INVENTION

1) Field of the Invention

This invention relates generally to fabrication and structures of semiconductor devices and more particularly to the fabrication of an Electro Static Discharge (ESD) device and more particularly an Electro Static Discharge (ESD) device using a silicide process The invention related to a device for on-chip ESD protection.

2) Description of the Prior Art

The n-type MOS transistor has been widely employed as the primary component for an ESD protection circuit in semiconductor IC devices. It is well known that silicidation of the drain and LDD junctions reduce ESD performance significantly. Most salicided process have a removal option which allows unsalicided areas (e.g., resistors) to be formed and use ESD implant to make junction deeper and to overdose the lightly doped region of the LDD for better ESD performance.

NMOS transistors stacked in a cascade configuration provide robust ESD protection for mixed voltage I/O in both silicided and silicide-blocked technologies. However, this kind of device has high snapback voltage. Also, the high snapback voltage of the stacked NMOS degrades its IT2 (IT2 is the second breakdown trigger current)) since the power dissipation is great. The IT2 is the current at or before the MOS gets into secondary breakdown (thermal/permanent damages) The higher the It2, the more robust the NMOS and the higher the ESD threshold. For the process technology where the silicide block and abrupt junction steps were are not available, a biasing network was necessary to ensure uniform triggering of all fingers. So, the need for high voltage tolerant I/O's severely complicates ESD protection.

FIG. 5A shows a single poly N-MOS device that is used in the prior art as an ESD device. The structure and snap back mechanism are described below. The single-poly N-MOS device is shown in cross section and layout in FIG. 5A. FIG. 5B shows a top plan view. FIG. 5C shows the IV curve and snap back curve for the ESD device. Vsp is the snapback holding voltage. FIG. 5D shows the electrical schematic of the device in FIG. 5A. When a short-duration (100 to 110 ns) constant current pulse is applied to the drain with the source and gate tied to the substrate (substrate grounded), the device should have the I-V characteristic shown in FIG. 5C. At normal operation, the device is off because the gate is grounded. When the drain breakdown voltage, BVdss is reached, current starts to flow as a result of impact ionization of die reverse-biased drain junction. At current It1, and voltage Vt1, the device triggers into snapback. The trigger current It1 and voltage is related to the channel length and BVdss. Note that the trigger voltage point (Vt1, It1,) is not the same as BVdss. BVdss, usually is defined as the drain junction avalanche breakdown voltage at a specified drain current density. The trigger point is the point that has the highest voltage just before snapback. The snapback region of the I-V curve is roughly linear and, therefore, may be represented by a snapback voltage Vsb and a differential resistance Rsb. The snapback voltage Vsb is defined as the linear extrapolation of the snapback region back to zero current. Care must be taken to avoid defining Vb and Rb by extrapolating from low current values near the point where the I-V curve changes slope from negative to positive. Therefore, the values of Vsb and Rsb were obtained from measurements made at high currents with the transmission-line pulse technique. Because the high-current values are relevant to ESD events, we need to use them rather than the low-current values when designing for protection against ESD. With sufficiently high current It2, flowing in the snapback region, the device triggers into second breakdown We define a second trigger point (Vt2, It2) corresponding to the triggering from snapback into second breakdown. Second breakdown is the term used for power bipolar devices to indicate the regime of thermal runaway and current-instability.

The following patents show related ESD devices U.S. Pat. No. 5,898,205(Lee), U.S. Pat. No. 5,519,242(Avery), U.S. Pat. No. 5,969,923(Avery), U.S. Pat. No. 5,559,352(Hsue et al.), U.S. Pat. No. 5,043,782(Avery) and U.S. Pat. No. 5,689,113(Li et al.).

There is a challenge to device a new ESD device for silicide process that improve the ESD performance by lowering the Vt1 and lower leakage.

SUMMARY OF THE INVENTION

It is an object of the present invention to provide a method for fabricating an ESD device with a lower trigger voltage and lower leakage.

It is an object of the present invention to provide a structure of an Electro Static Discharge (ESD) device that provides better protection without process changes and additional costs.

It is an object of the present invention to provide an IC design having a structure of an Electro Static Discharge (ESD) device to be used in IC chip manufactured with a silicided process.

It is an object of the present invention to provide a method and a structure of an ESD device that overcomes the problems associated with silicided drains.

It is an object of the present invention to provide a method and a structure of an ESD device for a silicided process that does not add any extra process steps or cost.

It is an object of the present invention to provide a method for fabricating a ESD device with silicide contacts with a lower trigger voltage and lower leakage using pseudo parasitic bipolar transistors.

To accomplish the above objectives, the present invention provides an ESD device and method of fabricating such device using parasitic NPN transistors. The invention has four preferred embodiments.

The first embodiment is a parasitic Bipolar Junction Transistor comprised of n+/n−/p−/n−/n+ regions. The emitter is formed of the N+ region and the second N− well. The parasitic base is formed by the p− substrate or well. The collector is formed of the first well and the first n+ region.

The benefit of the first embodiment is the trigger voltage is lower because the junction between the n− well (emitter) and P− substrate (base) and the junction between P− substrate (base) and the n-well have lower cross over concentrations. The lower the cross over concentration, the lower the trigger voltage (Vt1, It1). The invention's cross over concentrations are lower than conventional NPN devices that use the N+, P junctions and do not have the invention's first and second n– wells.

The second embodiment is similar to the first embodiment with the addition of the first gate. The first gate is preferably connected to the first n+ region and the Vpad (connected to Vdd).

The third embodiment contains the same elements as the second embodiment with the addition of a third n+ region. The third n+ region is preferably shorted (or connected) to the first p+ region and the second n+ region. The third embodiment forms a second NPN parasitic bipolar using the third N+ region as an emitter.

The forth embodiment contains the same elements as the third embodiment with the addition of a second gate over the first isolation region. The second gate is preferably connected to the third n+ region to the first p+ region and the second n+ region. The gate changes the electrical characteristics of the first parasitic bipolar transistor.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 5C shows the IV curve and snap back curve for the ESD device according to the prior art.

FIG. 5D shows the electrical schematic of the device in FIG. 5A according to the prior art.

DETAILED DESCRIPTION OF THE PREFERRED EMBODIMENTS

A. 1$^{st}$ Embodiment

Figure 1:
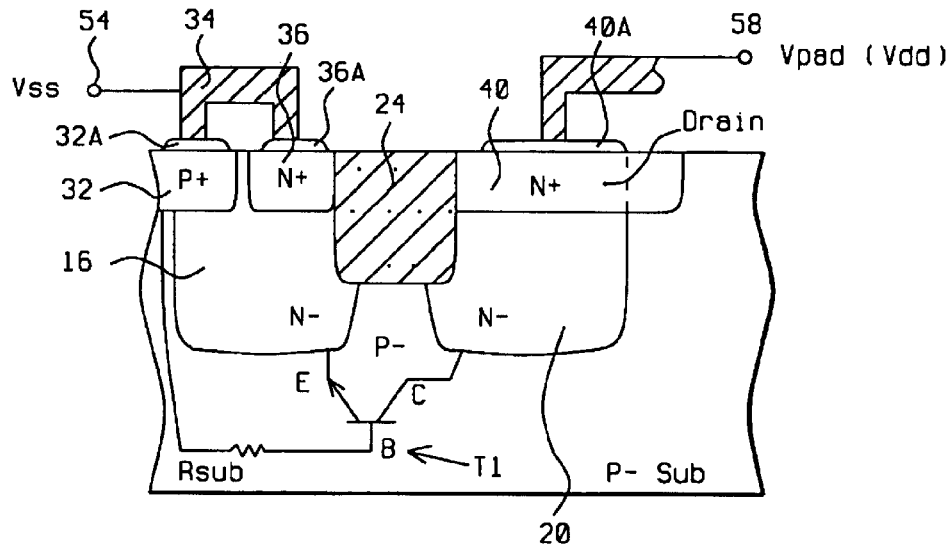
FIG. 1 is cross sectional view for illustrating a first embodiment an ESD device according to the present invention.
Figure 2:
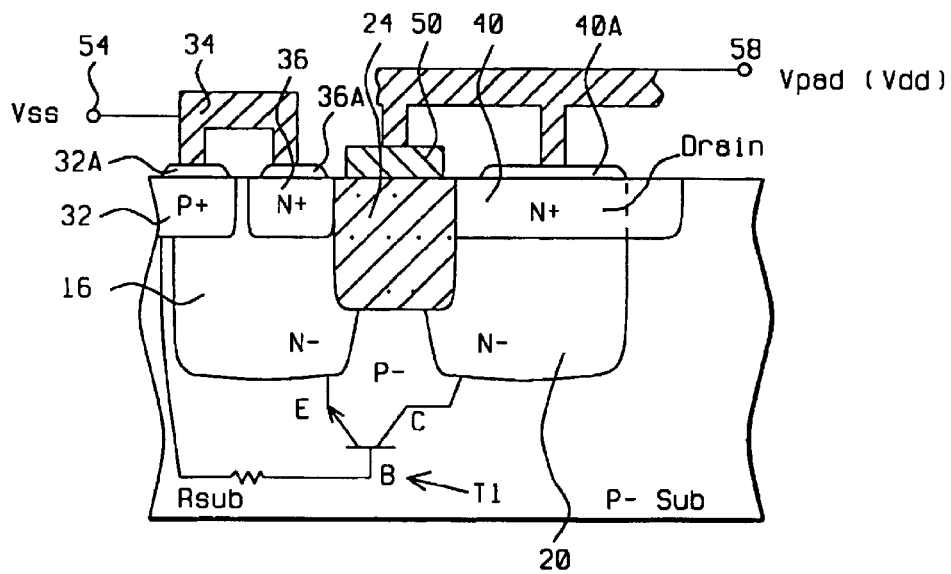
FIG. 2 is cross sectional view for illustrating a second embodiment an ESD device according to the present invention.

FIG. 1 shows the first embodiment of the invention that uses a N-MOS structure in a fully silicided process. The first embodiment is a parasitic Bipolar Junction Transistor comprised of n+/n–/p–/n–/n+ (40/20/10/36/32). The emitter is formed of the N+ region 36 and the second N– well 16. The parasitic base is formed by the p– substrate or well 10. The collector is formed of the first well 20 and the first n+ region 40. Also, it is important to note that all n+ and p+ regions have silicide (or salicide) overlying.

Figure 5A:
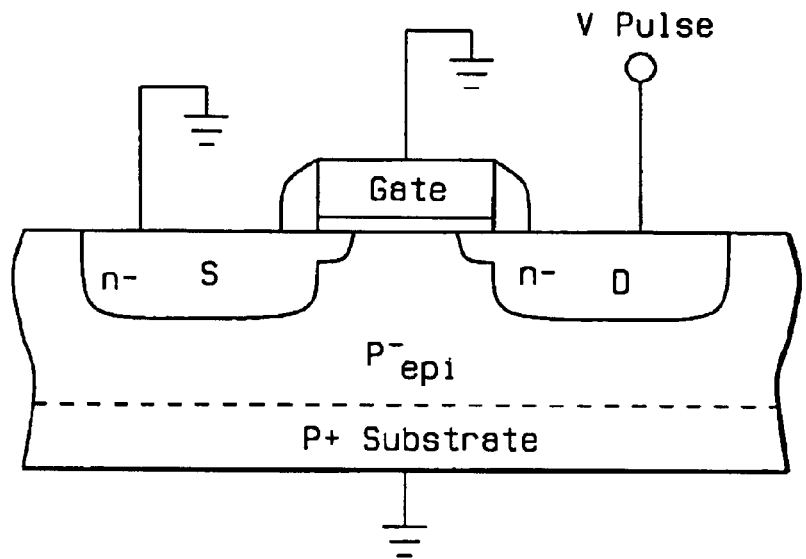
FIG. 5A shows a single poly N-MOS device that is used in the prior art as an ESD device.
Figure 5B:
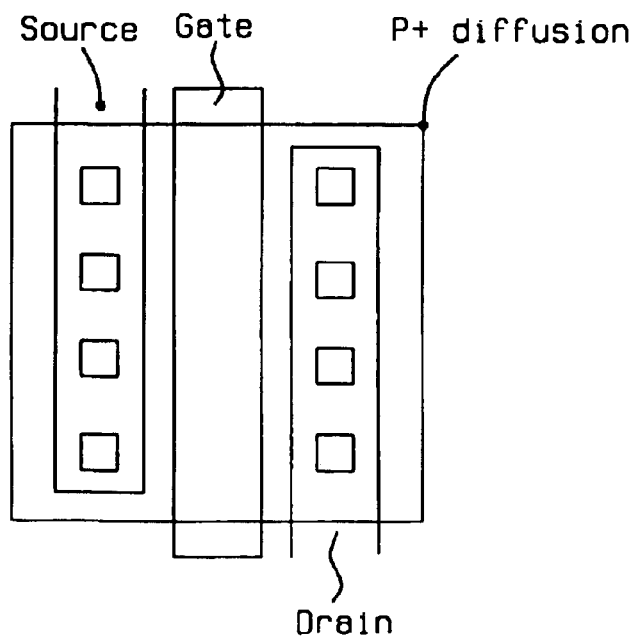
FIG. 5B shows a top plan view of the single poly N-MOS device shown in FIG. 5A according to the prior art.

The benefit of the first embodiment is the trigger voltage (Vt1, It1 on FIG. 5A) is lower because (1) the junction between the n– well 16 (emitter) and P– substrate 10 (base) and (2) the junction between P– substrate 10 (base) and the n-well 20 have lower cross over concentrations. The lower the cross over concentration the lower the trigger voltage (Vt1, It1). The invention's cross over concentrations are lower than conventional ESD devices that use the N+, P– junctions and do not have the invention's (N– P– junction) first and second n– wells 16 and 20.

Detailed Description of the First Embodiment

The first embodiment is described in more detail below. As shown in FIG. 1A, the electro-static discharge (ESD) protection device comprises the following elements. The method of forming the invention involves forming these elements.

A first n+ region 40 and a second n+ region 36 are separated by a first isolation region 24 in a substrate 10. The substrate 10 is p– doped.

A first n– well 20 overlaps only a portion of the first isolation region 24 and overlapping a portion of the first n+ region 40.

A first p+ region 32 is adjacent to, but does not contact the second n+ region 36.

A second n– well 16 overlaps a portion of the first p+ region 32 and all of a second n+ region 36. The second n+ region 36 abutting a first isolation region 24. The second n– well 16 overlaps a portion of the first isolation region 24. The second n– well is between the first p+ region 32 and the second n+ region 36.

The first P+ region 32, and the second N+ region 36 are connected (e.g., 34) in parallel to a source 54.

Silicide regions 32A 36A 40A are over the first and second N+ regions 36 40 and the first p+ region 32

Method for First Embodiment

We form a first n+ region 40 and a second n+ region 36 are separated by a first isolation region 24 in a substrate 10. The substrate 10 is p– doped.

We form a first n– well 20 overlaps only a portion of the first isolation region 24 and overlapping a portion of the first n+ region 40.

We form a first p+ region 32 is adjacent to, but does not contact the second n+ region 36.

We form a second n– well 16 overlaps a portion of the first p+ region 32 and all of a second n+ region 36. The second n+ region 36 abutting a first isolation region 24. The second n– well 16 overlaps a portion of the first isolation region 24. The second n– well is between the first p+ region 32 and the second n+ region 36.

The first P+ region 32 and the second N+ region 36 are connected (e.g., 34) in parallel to a source 54. We can form this connection using conductive lines.

We form silicide regions 32A 36A 40A are over the first and second N+ regions 36 40 and the first p+ region 32

These method steps can be performed in any order used in semiconductor manufacturing.

B. Second Embodiment

The second embodiment is similar to the first embodiment with the addition of the first gate 50 over the isolation region 24. The first gate 50 is preferably connected to the first n+ region 40 and the Vpad 58

The method of the second embodiment is similar to the first embodiment with the additional step of forming the first gate 50 over the isolation region 24. Also, we preferably connect the first gate 50 to the first n+ region 40 and the Vpad 58.

It is theorized that the gate 50, when charged by a Vpad voltage, will create an electric field under the first isolation region 24 and possibly create an inversion layer or a accumulation layer. This layer could lower the Vt1 (trigger voltage) of the parasitic bipolar ESD device.

C. Third Embodiment

Figure 3:
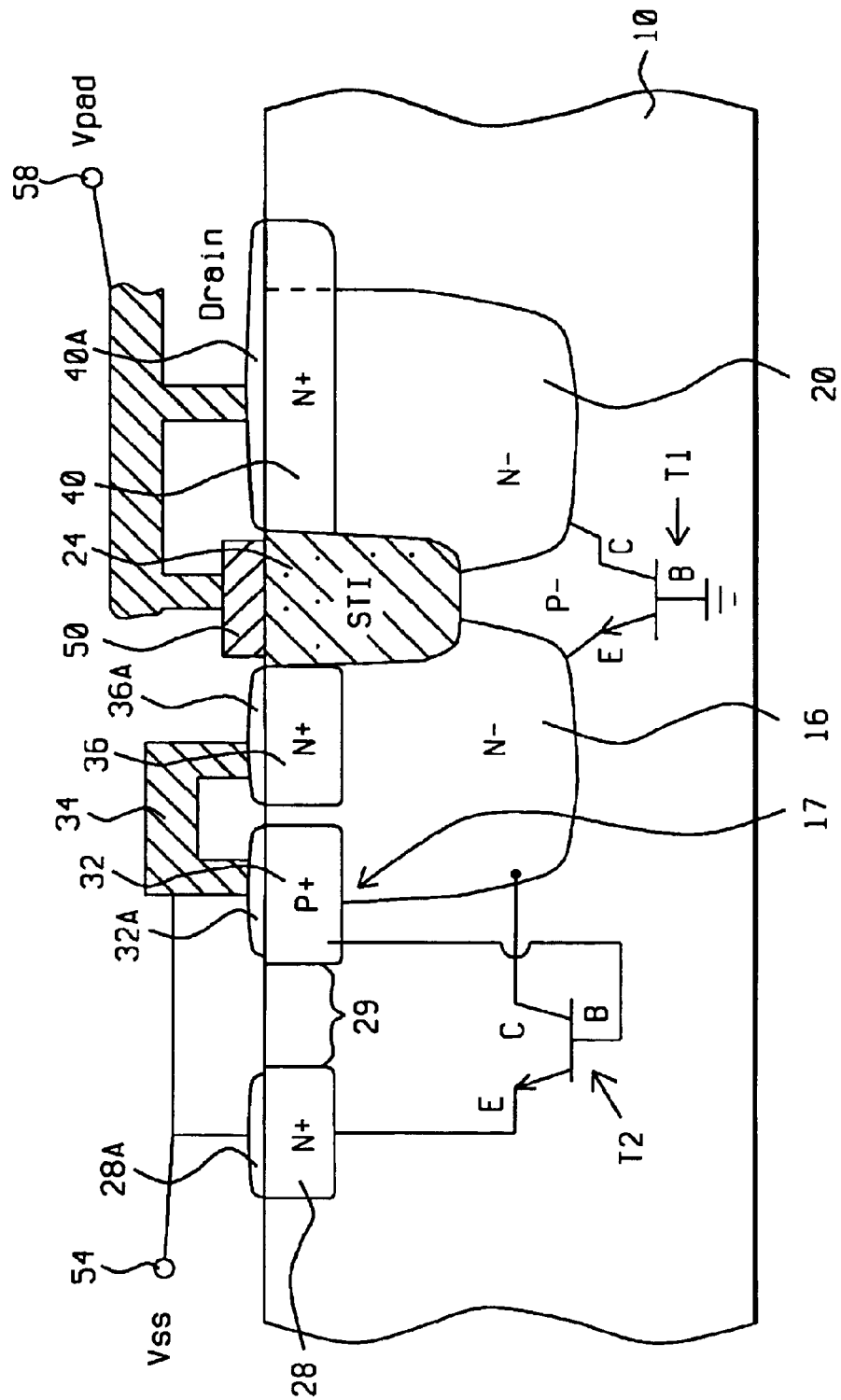
FIG. 3 is cross sectional view for illustrating a third embodiment an ESD device according to the present invention

As shown in FIG. 3, the third embodiment contains the same elements as the second embodiment with the addition of a third n+ region 28. As shown in FIG. 3, a second NPN bipolar (T2) is formed: collector (e g., N+ 36, N− well 16), base (p+ 32 and P− substrate 10) and emitter (N+28).

The method of the third embodiment is similar to the second embodiment with the additional step(s) of forming the a third n+ region 28.

The third n+ region 28 is preferably shorted (or connected 34) to the first p+ region 32 and the second n+ region 36. Also, all the n+ and P+ regions have silicide regions overlying (e.g., 28A silicide).

Circuit Analysis for the $3^{rd}$ Embodiment

The device can go into snap back mode because of the third n+ region 28.

The $3^{rd}$ embodiment's ESD device forms two parasitic bipolar transistors. The first Tx (T1) is the same as in the first and second embodiment. The second parasitic bipolar Tx (T2) is made up of the:

emitter=third n+ region (28),

Parasitic base=the p− substrate 10 and the p+ region 32

Collector=the n− well 16 and the second n+ region 36

D. Fourth Embodiment

Figure 4:
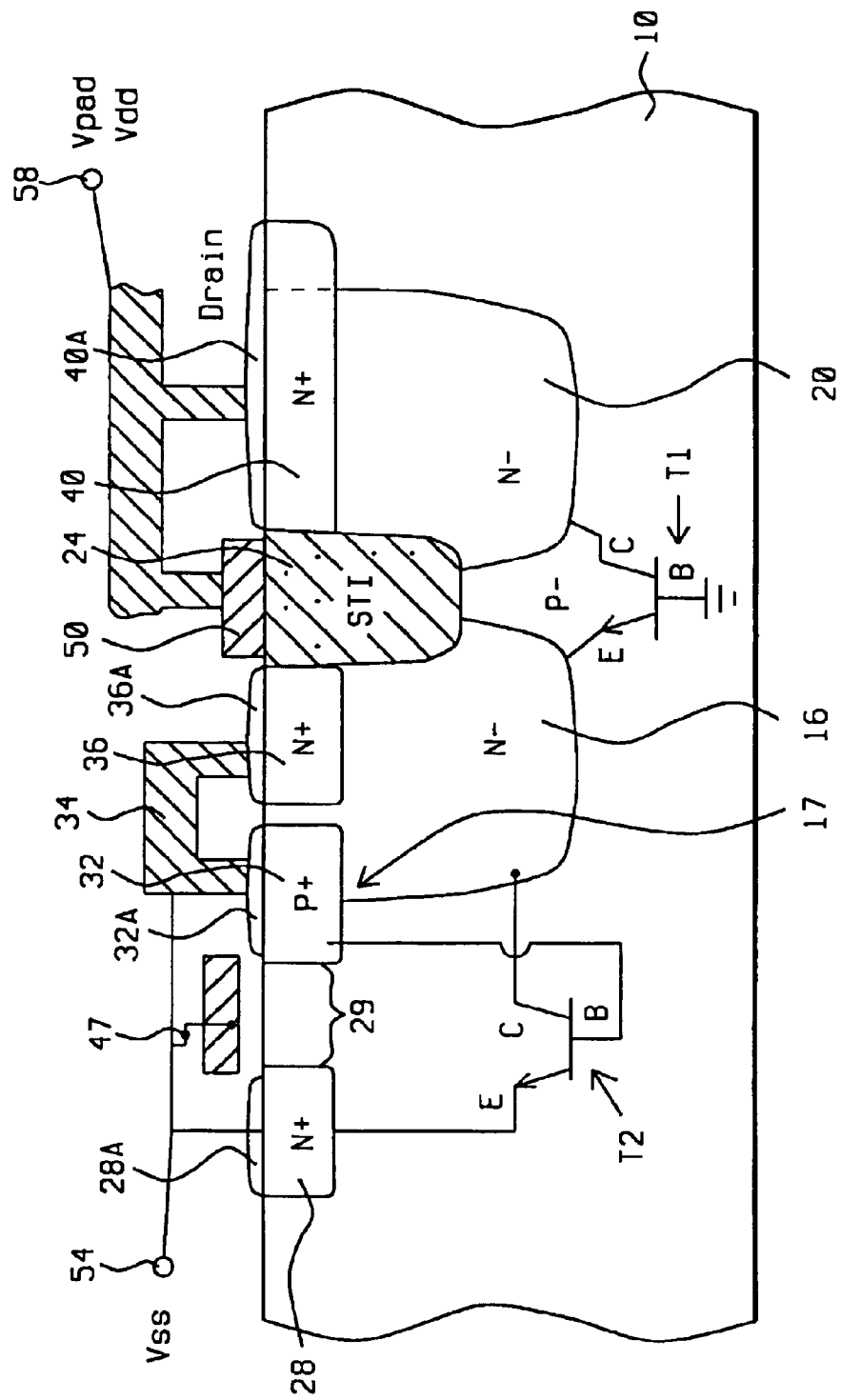
FIG. 4 is cross sectional view for illustrating a fourth embodiment an ESD device according to the present invention.

As shown in FIG. 4A, the forth embodiment contains the same elements as the third embodiment with the addition of a second gate 46.

The method of the fourth embodiment is similar to the third embodiment with the additional step(s) of forming the a second gate 46.

The second gate 46 is preferably connected to the third n+ region 28 to the first p+ region 32 and the second n+ region 36 (by a connection means 47).

Circuit Analysis for the 4th Embodiment

The fourth embodiment of the invention in theory operates similar to the third embodiment with the addition of the second gate 46. The second gate, when charged, can create an electric field with can turn on or turn off the second parasitic bipolar (T2) at a lower or higher trigger voltage and preferably lower trigger voltage.

Preferably the second gate is connected 47 to the Vss 54, the third n+ region 28, the first p+ region 32 and the second n+ region 36. The second gate can create a e-field that can change the operation of the T2 parasitic bipolar Tx to increase the ESD performance. Q—Inventor—please add more description if necessary.

Details of the $4^{th}$ Embodiment

The fourth embodiment is described is more detail below.

A first n+ region 40 and a second n+ region 36 are separated by a first isolation region 24 in a substrate 10. The substrate 10 is p− doped.

A first n− well 20 overlaps only a portion of the first isolation region 24 and overlaps only a portion of the first n+ region 40.

A first p+ region 32 is adjacent to, but does not contacting the second n+ region 36.

A second n− well 16 overlaps a portion of the first p+ region 32 and all of a second n+ region 36. The second n+ region 36 abuts a first isolation region 24. The second n− well 16 overlaps a portion of the first isolation region 24. The second n− well between the first p+ region 32 and the second n+ region 36.

A third n+ region 28 is separated from a first p+ region 32 by a channel region 29 (under the gate 46) in the substrate 10. A first gate 50 on the first isolation region 24. A second gate 46 over the channel region 29. The second gate 46 is insulated from the substrate by a gate dielectric layer.

The third n+ region 28, the first P+ region 32, and the second N+ region 36 are connected in parallel to a source 54.

Silicide regions 32A 36A 40A 28A are over the first, second and third N+ regions 36 40 28 and the first p+ region 32.

Preferably, the second gate is connected 47 to the Vss 54, the third n+ region 28, the first p+ region 32 and the second n+ region 36.

$V_{ss}$ means negative supply. $V_{DD}$ means positive supply.

The method steps for all embodiments can be performed in any order used in semiconductor manufacturing.

A major advantage of all four embodiment is that no salicide block is needed or used.

Although this invention has been described relative to specific insulating materials, conductive materials and apparatuses for depositing and etching these materials, it is not limited to the specific materials or apparatuses but only to their specific characteristics, such as conformal and non-conformal, and capabilities, such as depositing and etching, and other materials and apparatus can be substituted as is well understood by those skilled in the microelectronics arts after appreciating the present invention While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. An electro-static discharge (ESD) protection device comprising:
    a) a first n+ region and a second n+ region separated by a first isolation region in a substrate; said substrate is p− doped;
    b) a first n− well overlapping a portion of said first isolation region and overlapping a portion of said first n+ region;
    c) a first p+ region adjacent to, but not contacting said second n+ region;
    d) a second n− well overlapping a portion of said first p+ region and all of the second n+ region; said first p+ region contacting said substrate having a p-type doping; said second n+ region abutting the first isolation region; said second n− well overlapping a portion of said first isolation region; said second n− well between said first p+ region and said second n+ region;
    e) said first P+ region and said second N+ region connected in parallel to a Vss; and
    f) silicide regions over the first and second N+ regions and the first p+ region.

2. An electro-static discharge (ESD) protection device comprising:
    a) a first n+ region and a second n+ region separated by a first isolation region in a substrate; said substrate is p− doped;

b) a first n− well overlapping a portion of said first isolation region and overlapping a portion of said first n+ region;

c) a first p+ region adjacent to, but not contacting said second n+ region;

d) a second n− well overlapping a portion of said first p+ region and all of the second n+ region; said first p+ region contacting said substrate having a p-type doping; said second n+ region abutting the first isolation region; said second n− well overlapping a portion of said first isolation region; said second n− well between said first p+ region and said second n+ region;

e) a first gate on said first isolation region;

f) said first P+ region and said second N+ region connected in parallel to a source; and g) silicide regions over the first and second N+ regions and the first p+ region.

3. An electro-static discharge (ESD) protection device comprising:

a) a first n+ region and a second n+ region separated by a first isolation region in a substrate; said substrate is p-doped;

b) a first n− well overlapping a portion of said first isolation region and overlapping a portion of said first n+ region;

c) a first p+ region adjacent to, but not contacting said second n+ region;

d) a second n− well overlapping a portion of said first p+ region and all of the second n+ region; said first p+ region contacting said substrate having a p-type doping; said second n+ region abutting the first isolation region; said second n− well overlapping a portion of said first isolation region; said second n−well between said first p+ region and said second n+ region;

e) said first P+ region, and said second N+ region connected in parallel to a Vss.

4. The electro-static discharge (ESD) protection device of claim 3 which further includes:

a first gate on said first isolation region.

5. The electro-static discharge (ESD) protection device of claim 3 which further includes:

a first gate on said first isolation region; said first gate connected to said first n+ region.

* * * * *